United States Patent
Yang et al.

(10) Patent No.: US 11,027,394 B2
(45) Date of Patent: Jun. 8, 2021

(54) LOAD CUP AND CHEMICAL MECHANICAL POLISHING APPARATUS AND METHOD OF MANUFACTURING INCLUDING THE SAME

(71) Applicant: Samsung Electronics Co., Ltd., Suwon-si (KR)

(72) Inventors: Jieun Yang, Seoul (KR); Dong-il Yoon, Anyang-si (KR); Taemin Earmme, Hwaseong-si (KR); Gui Hyun Cho, Hwaseong-si (KR); Seok Heo, Hwaseong-si (KR); Jong Hwi Seo, Suwon-si (KR); Yong Won Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 418 days.

(21) Appl. No.: 16/022,166

(22) Filed: Jun. 28, 2018

(65) Prior Publication Data
US 2019/0176291 A1    Jun. 13, 2019

(30) Foreign Application Priority Data
Dec. 13, 2017 (KR) .................. 10-2017-0171130

(51) Int. Cl.
*B24B 37/34* (2012.01)
*B24B 37/005* (2012.01)
(Continued)

(52) U.S. Cl.
CPC .......... *B24B 37/345* (2013.01); *B24B 37/005* (2013.01); *H01L 21/6719* (2013.01);
(Continued)

(58) Field of Classification Search
CPC . B24B 37/345; B24B 37/005; H01L 21/6719; H01L 21/68764; H01L 21/68785; H01L 21/68792
See application file for complete search history.

(56) References Cited

U.S. PATENT DOCUMENTS 6,402,598 B1 * 6/2002 Ahn .................. B24B 37/345
                                                   451/288
6,629,883 B2 * 10/2003 Katsuoka ............. B24B 37/345
                                                   451/332
(Continued)

FOREIGN PATENT DOCUMENTS

JP    2003-048157 A    2/2003
JP    2003-053661 A    2/2003
(Continued)

OTHER PUBLICATIONS

Office Action dated Apr. 16, 2021 from the Korean Intellectual Property Office for Corresponding Korean Application KR 10-2017-0171130.

*Primary Examiner* — Dung Van Nguyen
(74) *Attorney, Agent, or Firm* — Muir Patent Law, PLLC

(57) ABSTRACT

Provided is a load cup including a cup having an internal space, a pedestal provided in the internal space, able to be lifted up and down, and loading a wafer onto or unloading a wafer from a polishing head, and a plurality of arrangement parts having a plurality of fastening portions disposed around the pedestal, and moved horizontally in a direction of a center of the pedestal, and arrangement part bodies coupled to the plurality of fastening portions, respectively, and rotated or reciprocated so as to contact a lateral surface of the polishing head, adjusting a center of the wafer to be aligned with a center of the polishing head. A polishing process may then be performed on a layer formed on the wafer.

20 Claims, 16 Drawing Sheets

(51) Int. Cl.
*H01L 21/687* (2006.01)
*H01L 21/67* (2006.01)

(52) U.S. Cl.
CPC .. *H01L 21/68764* (2013.01); *H01L 21/68785* (2013.01); *H01L 21/68792* (2013.01)

(56) References Cited

U.S. PATENT DOCUMENTS

| | | | |
|---|---|---|---|
| 6,840,846 B2 | 1/2005 | Boo et al. | |
| 6,872,129 B2 | 3/2005 | Tobin | |
| 7,044,832 B2 | 5/2006 | Yilmaz et al. | |
| 7,063,598 B2* | 6/2006 | Isobe | B24B 37/345 451/285 |
| 7,101,253 B2 | 9/2006 | Olgado | |
| 7,258,599 B2* | 8/2007 | Shirasu | B24B 37/30 451/388 |
| 7,445,543 B2* | 11/2008 | Torii | B24B 37/345 451/289 |
| 8,118,640 B2* | 2/2012 | Takahashi | H01L 21/67751 451/6 |
| 8,734,202 B2 | 5/2014 | Lischka et al. | |

FOREIGN PATENT DOCUMENTS

| | | |
|---|---|---|
| KR | 1020050095918 | 10/2005 |
| KR | 1020070095014 | 9/2007 |
| KR | 10-0997651 B1 | 12/2010 |

* cited by examiner

II-II'

IV—IV'

LOAD CUP AND CHEMICAL MECHANICAL POLISHING APPARATUS AND METHOD OF MANUFACTURING INCLUDING THE SAME

CROSS-REFERENCE TO RELATED APPLICATION

This application claims benefit of priority to Korean Patent Application No. 10-2017-0171130, filed on Dec. 13, 2017, with the Korean Intellectual Property Office, the disclosure of which is incorporated herein by reference in its entirety.

BACKGROUND

1. Field

The present disclosure relates to a load cup and a chemical mechanical polishing apparatus and method including the same.

2. Description of Related Art

A chemical mechanical polishing (CMP) process is a process of planarizing the surface of a substrate by combining a mechanical polishing effect through friction between a wafer and a polishing pad with a chemical reaction effect of a slurry, a chemical compound containing an abrasive.

Such a CMP process has been widely used to planarize various types of material in a process of polishing a silicon oxide film for the purpose of forming an interlayer dielectric (ILD) or shallow trench isolation (STI) structure, a tungsten (W) plug formation process, a copper (Cu) wiring process, and the like. As described above, since the CMP process has been in widespread use in a production process for a semiconductor device, there is an increasing demand for improving the production efficiency of the semiconductor device by increasing efficiency of equipment used in such a CMP process.

SUMMARY

An aspect of the present inventive concept may improve the efficiency of equipment used in a chemical mechanical polishing (CMP) process.

In one embodiment, a method of manufacturing a semiconductor device includes receiving a semiconductor wafer on a pedestal in a cup having an internal space, wherein the pedestal is provided in the internal space, and is configured to be lifted up and lowered down, and a plurality of arrangement parts having a plurality of respective base portions and a plurality of respective arrangement part bodies coupled thereto are disposed around the pedestal. The method further includes lowering the pedestal within the cup so that the wafer is disposed between wafer fixation portions of the arrangement part bodies, lowering a polishing head into the cup so that at least part of the polishing head is disposed between polishing head connection portions of the arrangement part bodies, and moving each of the plurality of arrangement parts horizontally in a direction toward a center of the pedestal. As a result of the moving, the arrangement part bodies are rotated or reciprocated so as to contact a lateral surface of the polishing head, thereby adjusting a center of the wafer to be aligned with a center of the polishing head. The wafer may then be picked up by the polishing head, and a polishing process may be performed on a layer formed on the wafer.

In one embodiment, a method of manufacturing a semiconductor device using chemical mechanical polishing includes providing a base part having a polishing pad and a load cup, and providing a polishing head. The load cup comprises a pedestal having a seating surface on which a wafer is seated, a cup having the pedestal disposed therein, and a plurality of arrangement parts disposed around the pedestal. The method additionally includes placing a wafer on the pedestal, lowering the pedestal within the load cup, and moving the arrangement parts horizontally in a direction toward a center of the pedestal. As a result of the moving, a polishing head connection portion of each arrangement part contacts a lateral surface of the polishing head, a wafer fixation portion of each arrangement part contacts a lateral surface of the wafer, and the wafer is aligned with the polishing head. The wafer may then be picked up by the polishing head, and a polishing process may be performed on a layer formed on the wafer.

A method of manufacturing a semiconductor device using chemical mechanical polishing apparatus includes providing a base part having a load cup, the load cup including a pedestal having a seating part for mounting a wafer and a cup in which the pedestal is received and having an upper surface with a through hole, inserting the polishing head in the through hole, providing a plurality of alignment parts having a plurality of respective fastening portions and a plurality of respective alignment part bodies disposed around the pedestal, using a plurality of respective driving parts, moving the plurality of alignment parts horizontally in a direction toward a center of the pedestal, and rotating or reciprocating alignment part bodies coupled to the plurality of fastening portions, respectively, so as to contact a lateral surface of the polishing head, and adjust a center of the wafer to be aligned with a center of the polishing head. The wafer may then be picked up by the polishing head, and a polishing process may be performed on a layer formed on the wafer.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Hereinafter, example embodiments of the present inventive concept will be described in detail with reference to the attached drawings.

Figure 1:
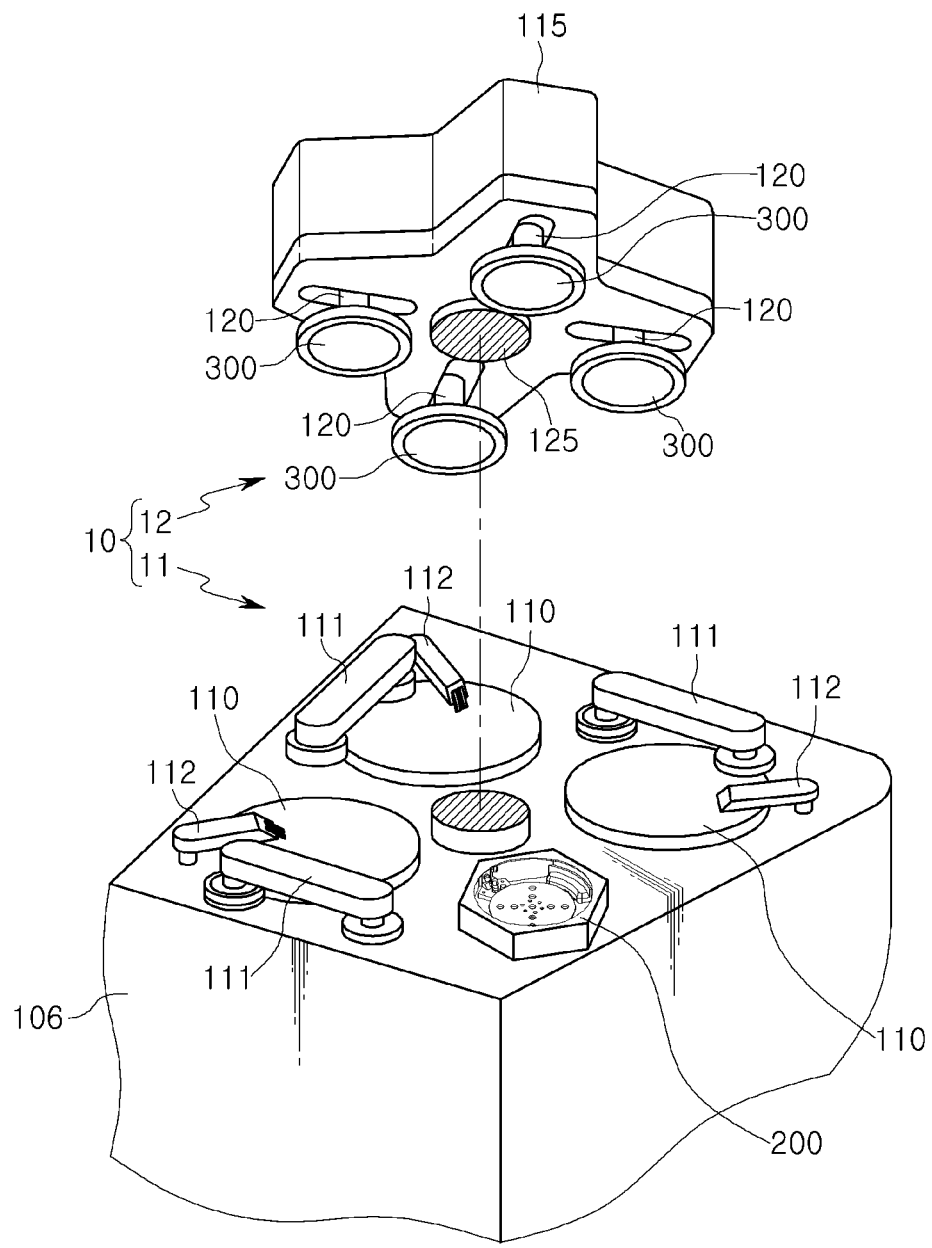
FIG. 1 is a perspective view schematically illustrating a chemical mechanical polishing apparatus, according to an example embodiment, in which a load cup may be employed.

Referring to FIG. 1, chemical mechanical polishing apparatus, according to an example embodiment, in which a load cup 200 may be employed, will be described. A chemical mechanical polishing apparatus 10 may include a polishing head rotation part 12 and a base part 11. The base part 11 may include a base 106, a plurality of polishing pads 110 provided on the base 106, a plurality of pad conditioners 111 disposed adjacent to the polishing pads 110, respectively, and adjusting a surface condition of each of the polishing pads 110, a plurality of slurry supply arms 112 disposed adjacent to the polishing pads 110, respectively, and supplying slurry to surfaces of the polishing pads 110, and the load cup 200 loading or unloading a wafer. The polishing head rotation part 12 may include a frame 115, a plurality of polishing heads 300 provided below the frame 115, and bringing a wafer loaded by the load cup 200 into contact with upper surfaces of the polishing pads 110 and rotating the wafer, and a plurality of rotary shafts 120 provided between the frame 115 and the polishing pads 110, and rotating the polishing heads 300, respectively. Here, the frame 115 may have a driving device for rotating each of the rotary shafts 120. The polishing head rotation part 12 may be supported by a central shaft 125, and may rotate around the central shaft 125. Each of the polishing heads 300 may have a plurality of flow channels therein. Pneumatic or vacuum pressure may be supplied to the polishing head 300 through the flow channels. In this case, the supplied pneumatic or vacuum pressure may provide adsorption force adsorbing a wafer provided below the polishing head 300, and pressure pressing a rear surface of the wafer, such that the wafer may be in contact with the polishing pad 110.

Figure 2:
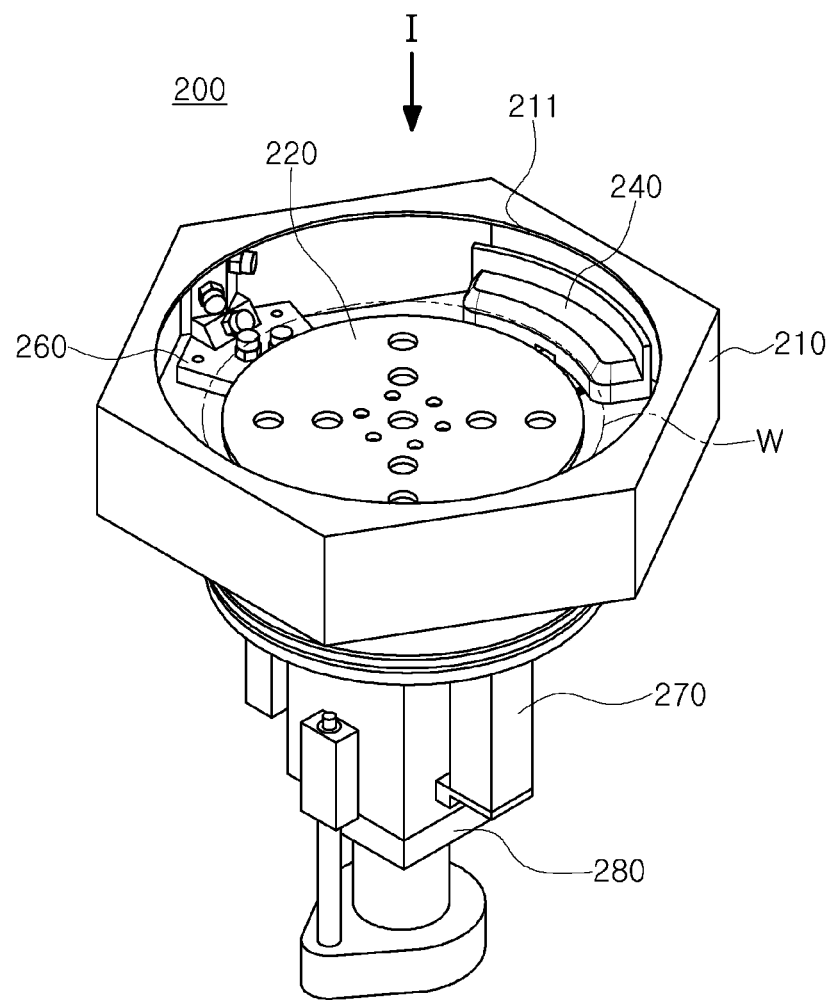
FIG. 2 is a perspective view schematically illustrating a load cup of a chemical mechanical polishing apparatus, according to an example embodiment.
Figure 3:
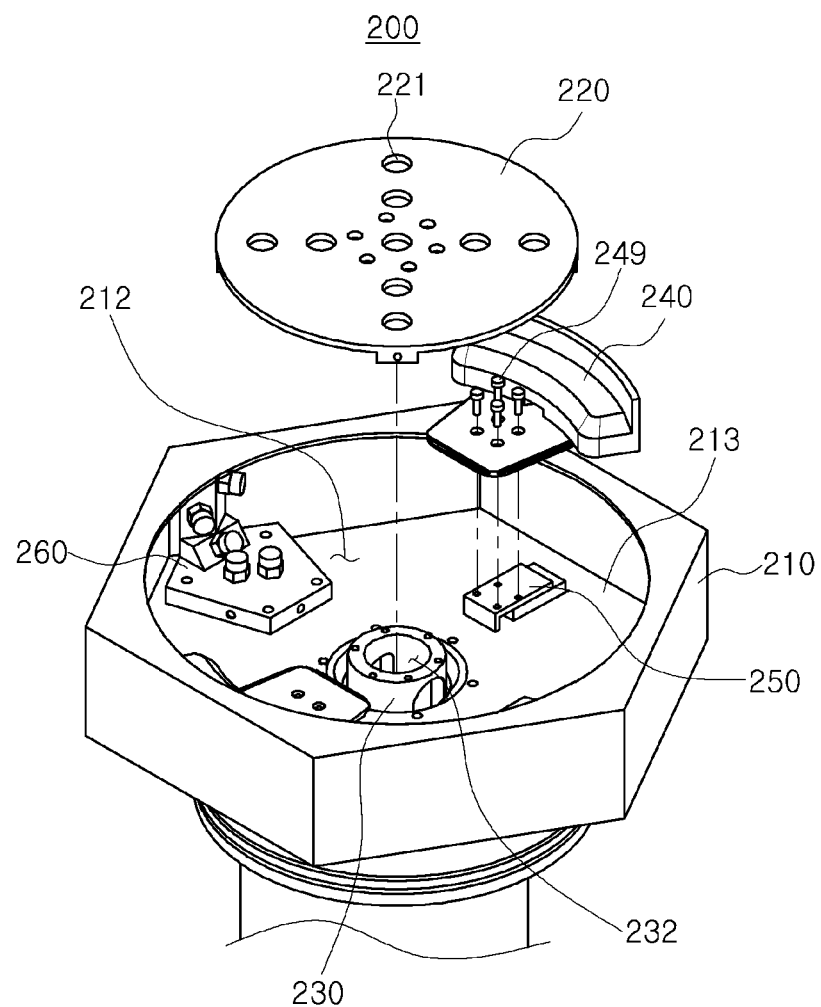
FIG. 3 is a partially exploded perspective view of the load cup of the chemical mechanical polishing apparatus of FIG. 2.
Figure 4:
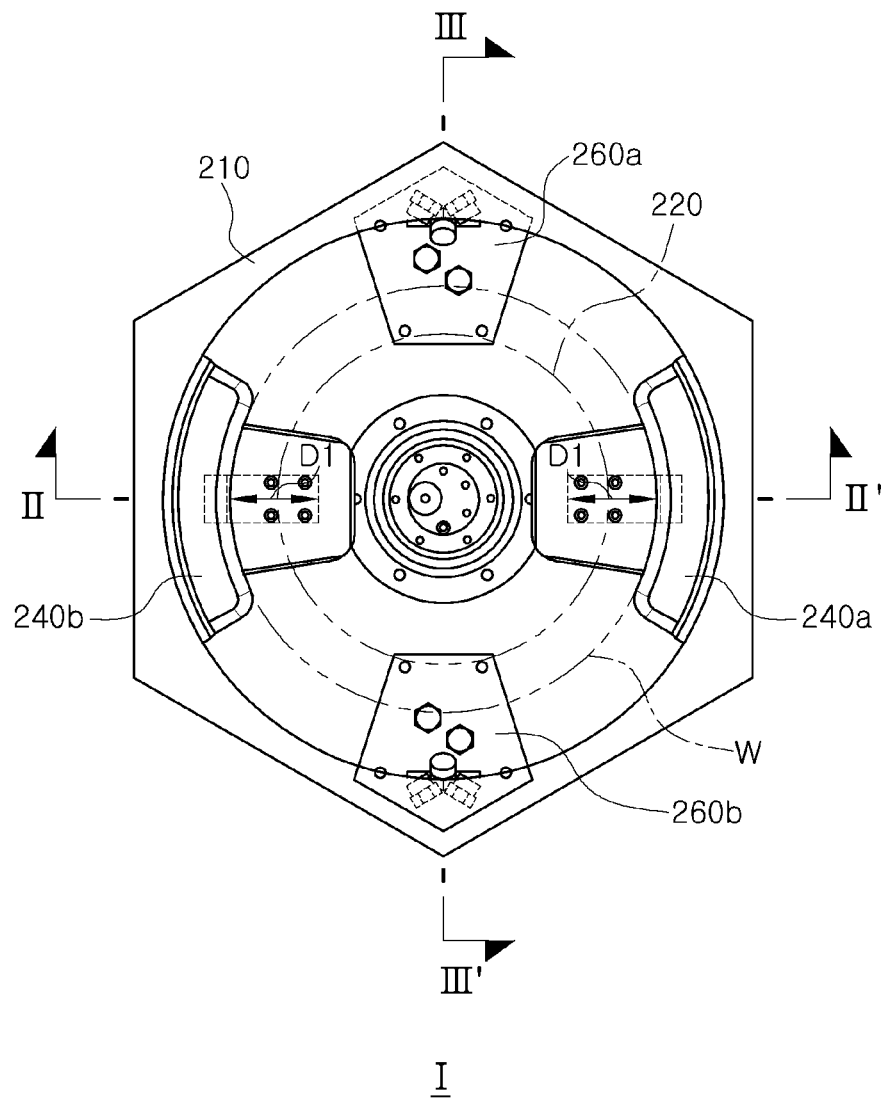
FIG. 4 is a plan view taken in direction "I" of FIG. 2.

The load cup 200 will be described hereinafter, with reference to FIGS. 2 through 4. FIG. 2 is a perspective view schematically illustrating a load cup of a chemical mechanical polishing apparatus, according to an example embodiment. FIG. 3 is a partially exploded perspective view of the load cup of the chemical mechanical polishing apparatus of FIG. 2. FIG. 4 is a plan view taken in direction "I" of FIG. 2.

Referring to FIGS. 2 and 3, the load cup 200 of the chemical mechanical polishing apparatus, according to an example embodiment, may include a cup 210, a pedestal 220, and arrangement parts 240. The cup 210 may further include a nozzle part 260 spraying a cleaning fluid such as deionized water (DIW).

The cup 210 may have an internal space 212 in which the pedestal 220, the arrangement parts 240, and the nozzle part 260 may be disposed, and a through hole 211 may be formed in an upper surface of the cup 210, and may have a size sufficient to allow the polishing head 300 illustrated in FIG. 1 to be inserted thereinto. The cup 210 may provide a space in which a wafer W and the polishing head 300 may be cleaned by the cleaning fluid sprayed by the nozzle part 260. The cup 210 may be lifted up by a cup driving part 270.

Figure 5:
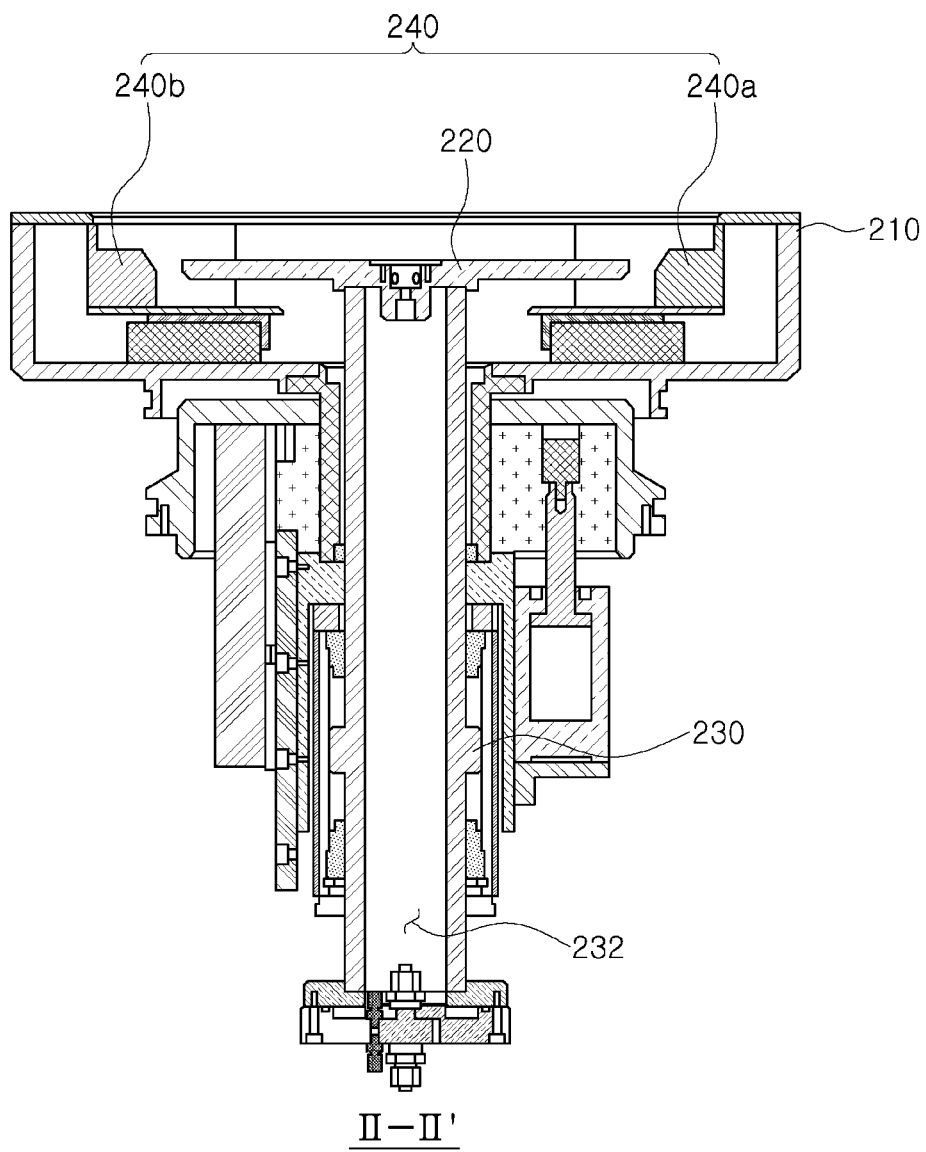
FIG. 5 is a cross-sectional view taken along line II-II' of FIG. 4.

Referring to FIGS. 3 and 5, the pedestal 220 may be provided to support the wafer W, and may have an upper surface, a seating surface, on which the wafer W may be seated, and a lower surface which may be supported by a support part 230 and may be lifted up by a pedestal driving part 280 connected to the support part 230 (please see FIG. 2). Further, a plurality of fluid ports 221 may be diagonally disposed in the upper surface of the pedestal 220 to adsorb the wafer W in a vacuum and spray the cleaning fluid. In an example embodiment, the fluid ports 221 may be arranged to have, for example, a cruciform shape. A pedestal film may be disposed on the upper surface of the pedestal 220 to prevent pollution of the pedestal 220. The pedestal film may be attached to the entirety of the upper surface of the pedestal 220, or may be selectively attached to a restricted portion, including the fluid ports 221, of the pedestal 220, for example, a portion required for vacuum adsorption and support of the wafer W, in order to reduce spread of contaminants.

The arrangement parts 240 may be disposed in the internal space 212 of the cup 210 to guide movement of the wafer W, in order to position the wafer W seated on the upper surface of the pedestal 220. Here, the term "position" may refer to aligning a center of the wafer W with that of the polishing head 300, such that the centers may coincide with each other. In this manner, the arrangement parts 240 may also be referred to as alignment parts, and may also be described as alignment steps, or alignment rails. In general, when the wafer W is seated on the pedestal 220, the centers of the wafer W and the pedestal 220 may be misaligned by vibrations or the like of a robot arm transferring the wafer W. When the wafer W is loaded on the polishing head 300 while the centers of the wafer W and the pedestal 220 are misaligned as described above, the wafer W may not be normally adsorbed onto the polishing head 300, thus failing to be normally loaded, or the weight of the wafer W may be biased to one side thereof, so that the wafer W may be damaged. Further, when a central axis of the polishing head 300 and that of the pedestal 220 are misaligned, the centers of the polishing head 300 and the wafer W may be misaligned in loading the wafer W on the polishing head 300.

Thus, aligning the center of the wafer W with that of the polishing head 300 can permit the wafer W to be normally loaded on the polishing head 300.

In some embodiments, the arrangement parts 240 may be disposed around the pedestal 220 at equal intervals. In an example embodiment, the arrangement parts 240 may include, for example, a first arrangement part 240a and a second arrangement part 240b, but they are not limited thereto, and may also include three or more arrangement parts. The first arrangement part 240a and the second arrangement part 240b may have the same structure, and only a detailed configuration of the first arrangement part 240a will be described in order to prevent repeated descriptions thereof.

Referring to FIGS. 3 and 4, the first and second arrangement parts 240a and 240b may be coupled to arrangement driving parts 250 disposed on a lower surface 213 of the cup 210 by coupling members such as screws 249. Arrangement driving parts 250 include portions that allow for the arrangement parts 240 to be moved horizontally forward and backward in a central direction D1 of the pedestal 220. The arrangement driving parts 250 may be configured to be moved horizontally forwards and backwards within a range of at least 10 mm, so as to clamp the wafer W by moving the first and second arrangement parts 240a and 240b, even when the wafer W is disposed such that the center of the wafer W may deviate from that of the pedestal 220. The arrangement driving parts 250 may be configured, such that the first and second arrangement parts 240a and 240b may be symmetrically disposed with respect to the center of the pedestal 220. Further, the arrangement parts 240 may be configured, such that the first and second arrangement parts 240a and 240b may be symmetrically moved with respect to the center of the pedestal 220. For example, the arrangement driving parts 250 may be disposed, such that the first and second arrangement parts 240a and 240b may be simultaneously moved toward or away from the center of the pedestal 220 at substantially the same speed.

Figure 6A:
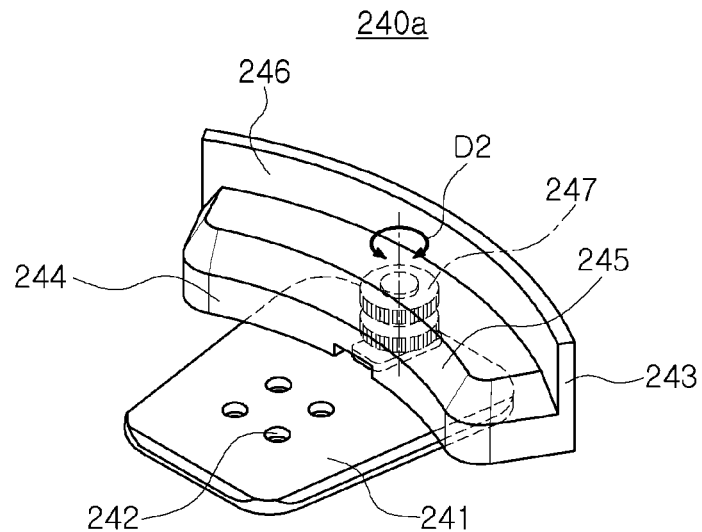
FIG. 6A is a perspective view schematically illustrating an arrangement part of FIG. 2.

Referring to FIGS. 3 and 6A, the first arrangement part 240a may include a fastening portion 241 coupled to each of the arrangement driving parts 250 disposed on the lower surface 213 of the cup 210, and an arrangement part body 243 coupled to the fastening portion 241 and contacting the wafer W and the polishing head 300. For example, the fastening portion, also described as a base portion, may be a plate with threaded holes therein for accepting screws or bolts.

The arrangement part body 243, also described as an arrangement block, or alignment block or alignment ledge, may have a wafer fixation portion 244 contacting a lateral surface of the wafer W, a sliding guide portion 245 extending upwardly from the wafer fixation portion 244, and including an inclined surface, and a polishing head connection portion 246 extending from the sliding guide portion 245 and contacting a lateral surface of the polishing head 300. For example, the wafer fixation portion 244, the sliding guide portion 245, and the polishing head connection portion 246 may be sequentially disposed on the arrangement part body 243. The wafer fixation portion 244 may also be referred to as a wafer holding wall, or a wafer alignment wall. The sliding guide portion 245 may also be referred to as an alignment guide wall, or alignment guiding ramp or slide. The polishing head connection portion 246 may also be referred to as a polishing head alignment wall.

The arrangement part body 243 may be coupled to the fastening portion 241 by a coupling member, so as to enable a rotary motion or a reciprocating motion. A member, such as a ball bearing, a linear motion guide, a ball bush, or a spring, may be used as the coupling member. In an example embodiment, for example, a ball bearing 247 may be employed as the coupling member, so that the arrangement part body 243 may be rotated on the fastening portion 241 in a D2 direction.

Figure 6B:
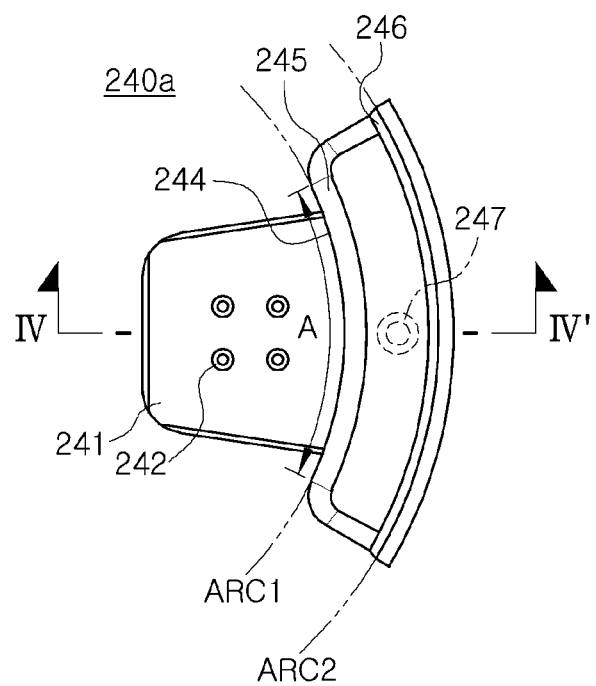
FIG. 6B is a plan view of FIG. 6A.
Figure 7A:
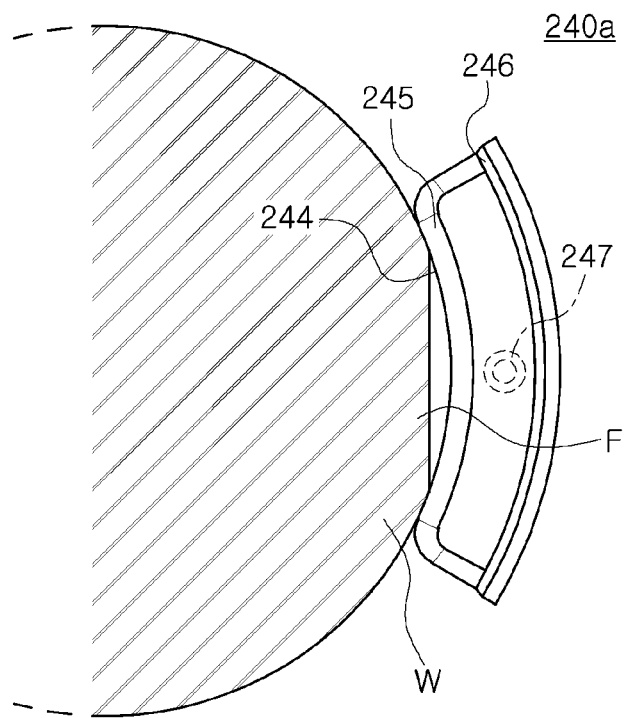
FIG. 7A is a view illustrating a flat zone of a wafer contacting the arrangement part of FIG. 6B.
Figure 7B:
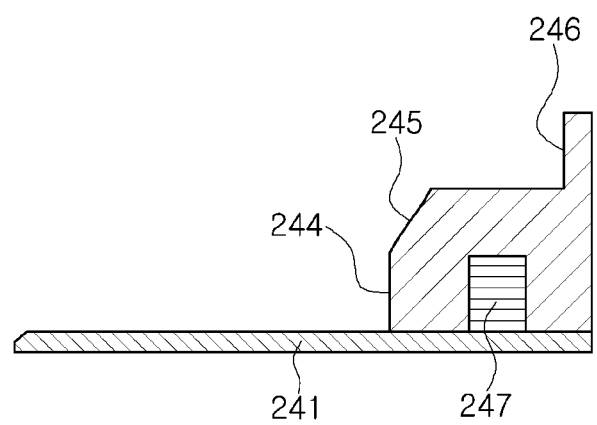
FIG. 7B is a cross-sectional view taken along line IV-IV' of FIG. 6B.

Referring to FIGS. 6B and 7A, the wafer fixation portion 244 may include a curved surface having a circular arc ARC1 corresponding to the lateral surface of the wafer W, and may contact the lateral surface of the wafer W so as to fix the wafer W. The wafer fixation portion 244 may have a length (e.g., measured in a straight line from one end of the arc ARC1 to the other end of the arc ARC1) greater than a width of a flat zone F of the wafer W. Thus, even when the flat zone F of the wafer W is in contact with the wafer fixation portion 244, the wafer W may be stably fixed to the wafer fixation portion 244.

The sliding guide portion 245 may include the inclined surface. Thus, even when the center of the wafer W is displaced from that of the pedestal 220 in unloading the wafer W from the polishing head 300, or seating the wafer W on the pedestal 220 to then be lifted down, the wafer W may slide down along the inclined surface so as to be seated on the wafer fixation portion 244.

The polishing head connection portion 246 may include a curved surface having a circular arc ARC2 corresponding to the lateral surface of the polishing head 300. Thus, when the polishing head connection portion 246 contacts the lateral surface of the polishing head 300 and the arrangement part body 243 is rotated, the wafer W contacting the wafer fixation portion 244 may be rotated in response to the rotation, so that the center of the wafer W may coincide with that of the polishing head 300.

Figure 8:
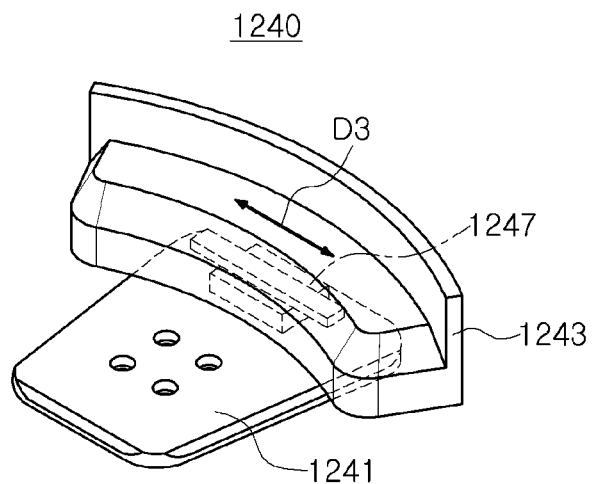
FIGS. 8 and 9 are modified examples of the arrangement part of FIG. 6A.
Figure 9:
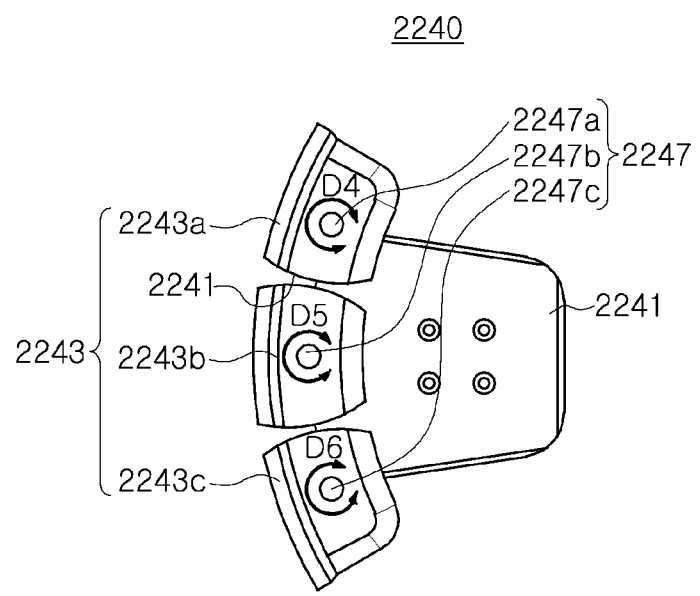

Referring to FIGS. 8 and 9, a modified example of the arrangement parts 240 will be described.

An arrangement part 1240 of FIG. 8 may include an arrangement part body 1243 coupled to a fastening portion 1241 by a coupling member 1247, such that the arrangement part body 1243 may reciprocate in a D3 direction, and a linear motion guide may be employed as the coupling member. Other configurations may be the same as those of the arrangement parts 240, according to an example embodiment, described above.

An arrangement part 2240 of FIG. 9 may include an arrangement part body 2243 divided into a plurality of regions 2243a, 2243b, and 2243c. In an example embodiment, the arrangement part 2240 may be divided into, for example, three regions, but is not limited thereto, and may also be divided into two or four or more regions. Further, coupling members 2247a, 2247b, and 2247c may be coupled to the regions 2243a, 2243b, and 2243c, respectively, and the regions 2243a, 2243b, and 2243c may be rotated in D4, D5, and D6 directions, respectively, independently of one another. Curved surfaces may be formed on opposite, facing surfaces 2241 of the regions 2243a, 2243b, and 2243c, respectively, so that the regions 2243a, 2243b, and 2243c may be smoothly rotated, respectively. Thus, since the arrangement part body 2243 is in smooth contact with the wafer W, an amount of impact acting on the wafer W when the arrangement part body 2243 contacts the wafer W may be reduced, thereby preventing damage to the wafer W.

Referring to FIG. 2, the nozzle part 260 may be disposed inside the load cup 200 to spray the cleaning fluid for cleaning a bottom surface and the lateral surface of the polishing head 300 (see FIG. 1) and a bottom surface of the wafer W. The nozzle part 260 may be disposed around the pedestal 220. In an example embodiment, the nozzle part 260 may include a first nozzle part 260a and a second nozzle part 260b, which may be disposed on both (e.g., opposite) sides of the pedestal 220, respectively (see FIG. 4). The first and second nozzle parts 260a and 260b may be disposed around the pedestal 220 at the same interval. The first and second nozzle parts 260a and 260b may have the same structure, and only a detailed configuration of the first nozzle part 260a will be described in order to prevent repeated descriptions thereof.

Figure 12:
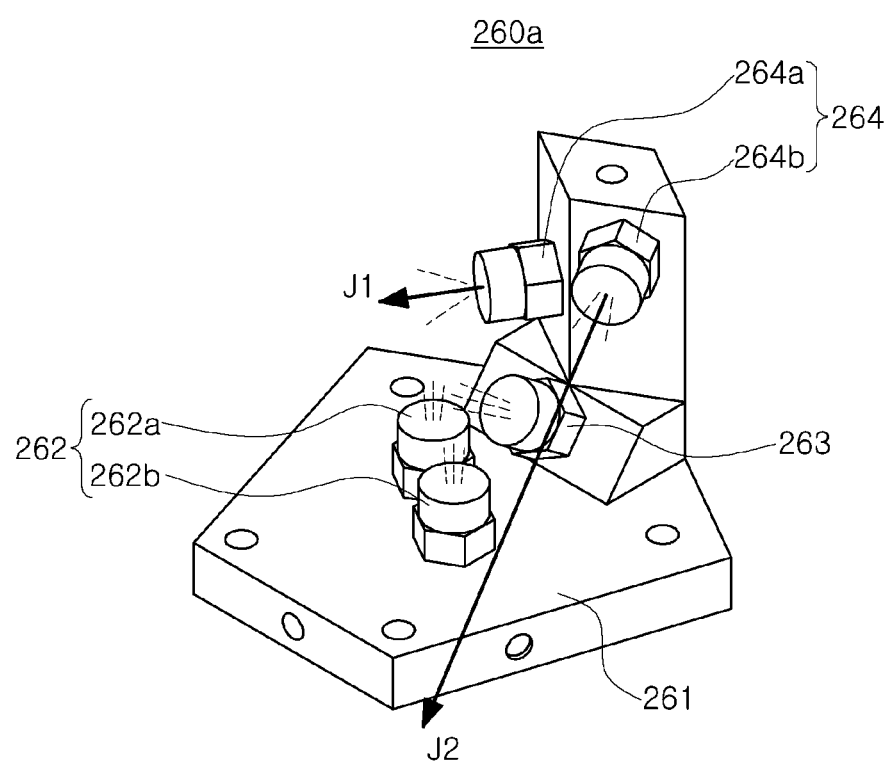
FIG. 12 is a perspective view of a nozzle part of FIG. 10.

Referring to FIG. 12, a plurality of nozzles may be disposed on the first nozzle part 260a in different spraying directions. In an example, first to third nozzle groups 262, 263, and 264 may be disposed on a support 261 toward different objects to be sprayed. Further, each of the first to third nozzle groups 262, 263, and 264 may include a plurality of nozzles, and a plurality of nozzles 262a and 262b included in a single nozzle group, for example, the first nozzle group 262, may be disposed in the same spraying direction. Further, a plurality of nozzles 264a and 264b included in a single nozzle group, for example, the third nozzle group 264, may be disposed in different spraying directions.

The first nozzle group 262 may be disposed to spray the cleaning fluid toward the bottom surface of the polishing head 300 (please see FIG. 1). The second nozzle group 263 may be disposed to obliquely spray the cleaning fluid toward the bottom surface of the polishing head 300. The third nozzle group 264 may be disposed parallel to the seating surface of the pedestal 220 to clean the lateral surface of the polishing head 300 and the wafer W. Further, the nozzles 264a and 264b of the third nozzle group 264 may be disposed to spray the cleaning fluid in different directions J1 and J2, and levels of the nozzles 264a and 264b may be different from each other. Such a nozzle arrangement may enable multidirectional cleaning upon the cleaning of the polishing head 300 and the wafer W, thus increasing cleaning efficiency.

Figure 10:
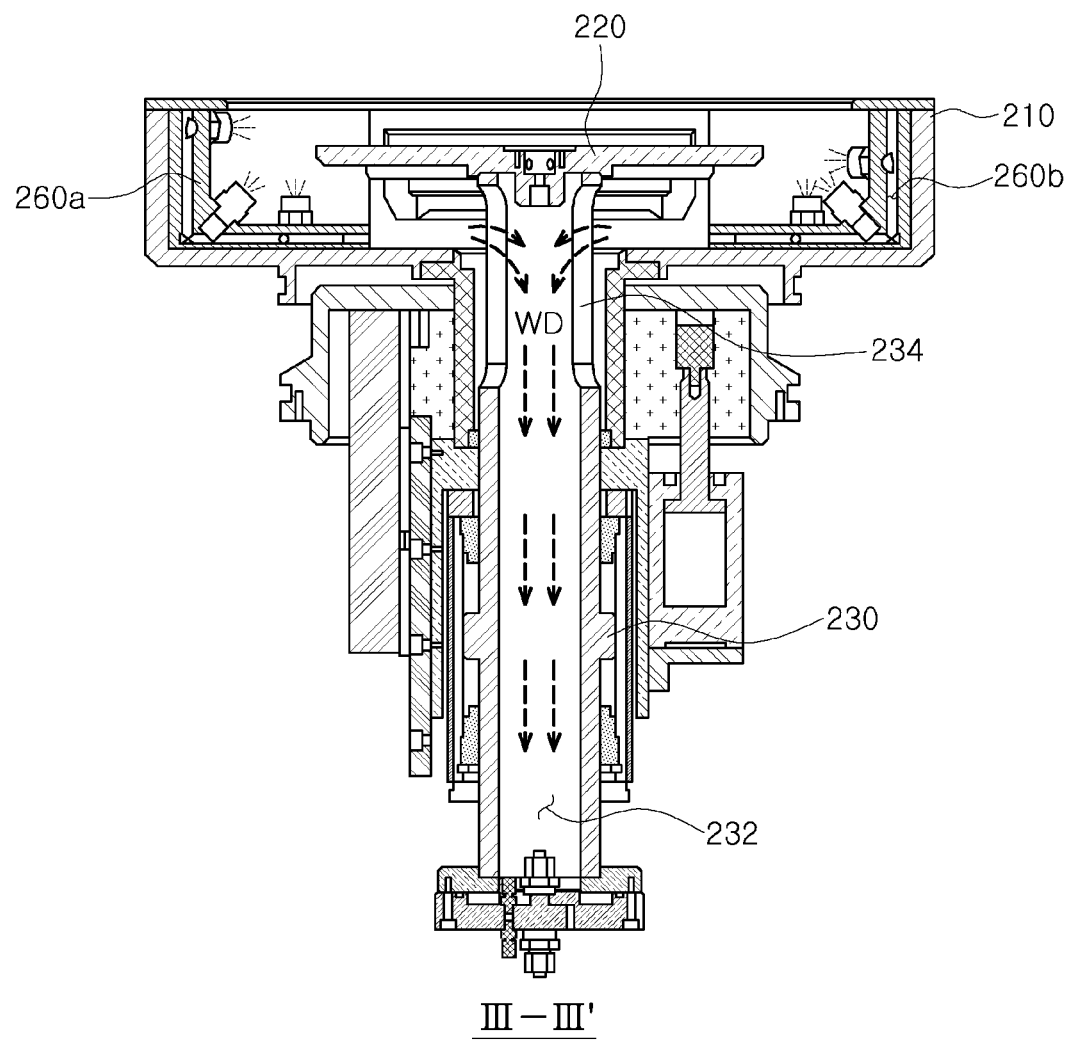
FIG. 10 is a cross-sectional view taken along line of FIG. 4.
Figure 11:
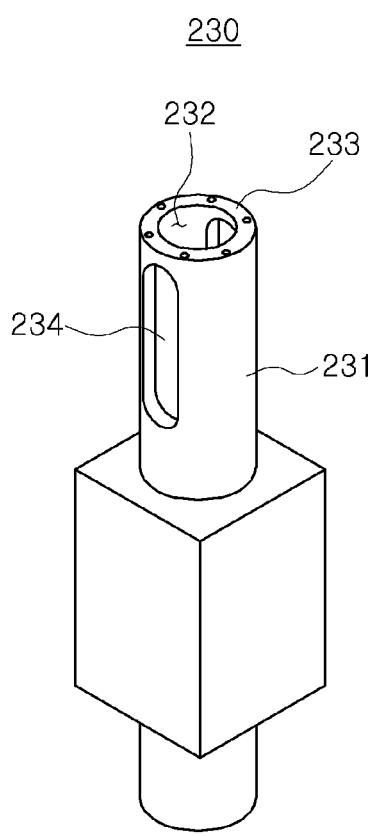
FIG. 11 is a perspective view of a support part of FIG. 10.

Referring to FIGS. 10 and 11, the pedestal 220 may be supported by the support part 230. The support part 230 may have a pedestal connection portion 233 formed on an upper end portion thereof to support the pedestal 220, and coupled to a bottom surface of the pedestal 220, and a lower end portion of the support part 230 may be connected to the pedestal driving part 280 (please see FIG. 2) to lift up the pedestal 220. The support part 230 may have an outer wall 231 of a cylindrical shape having a hollow portion 232. In an upper portion of the support part 230, a drain hole 234 may be formed through the outer wall 231 of the hollow portion 232 in a location corresponding to the lower surface 213 of the cup 210.

As illustrated in FIG. 10, the drain hole 234 may be used as a drain through which the cleaning fluid sprayed by the first and second nozzle parts 260a and 260b may be discharged after cleaning the wafer W and the polishing head 300. Thus, the drain hole 234 may be formed in a region corresponding to the lower surface 213 of the cup 210, so that the cleaning fluid used may flow into the hollow portion 232 through the drain hole 234 and may be discharged in a natural drainage direction WD. Further, even when the support part 230 is lifted up, the drain hole 234 may have a length sufficient for being disposed in a location corresponding to the lower surface 213 of the cup 210, so as to allow the cleaning fluid to be discharged therethrough, regardless of the lifting of the support part 230.

Such a structure of the support part 230 may result in ensuring, in a center of the lower surface 213 of the cup 210, a drain for easily discharging the cleaning fluid used, so that the cleaning fluid not discharged may be prevented from being collected in the cup 210. Thus, an apparatus inside the load cup 200 may be prevented from being damaged by the cleaning fluid not having been discharged.

Operations of the load cup of the chemical mechanical polishing apparatus of FIG. 2 will be described with reference to FIGS. 13A, 13B, 14A, 14B, 15A, 15B, 16A, and 16B. FIGS. 13A, 13B, 14A, 14B, 15A, 15B, 16A, and 16B are views schematically illustrating the operations of the load cup of the chemical mechanical polishing apparatus of FIG. 2.

Figure 13A:
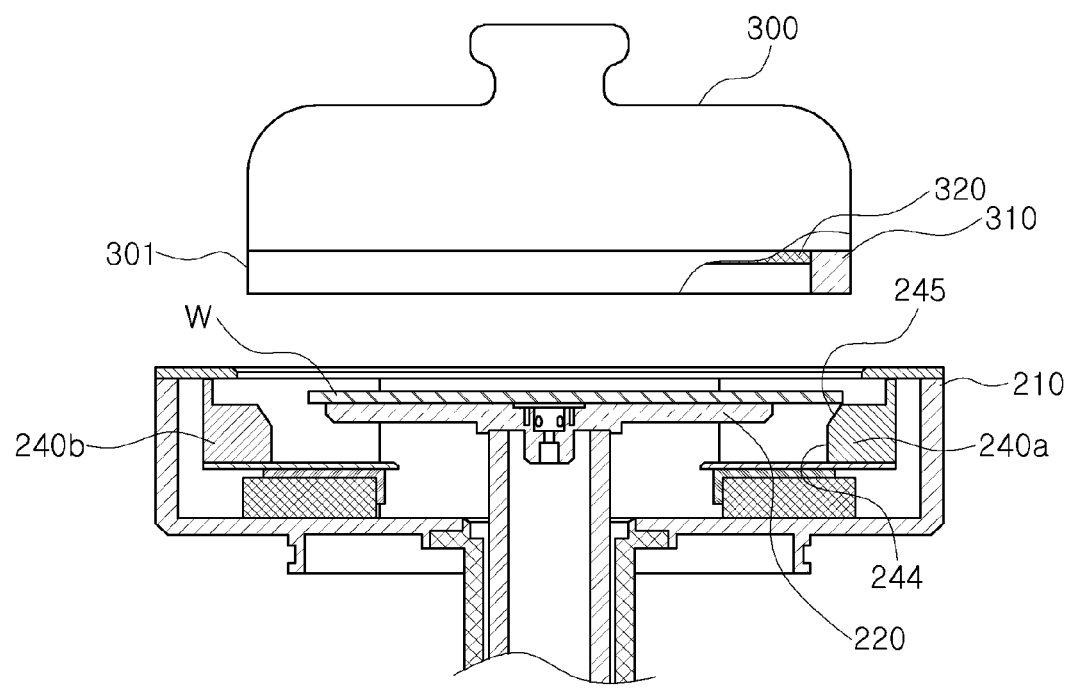
FIGS. 13A, 13B, 14A, 14B, 15A, 15B, 16A, and 16B are views schematically illustrating operations of the load cup of the chemical mechanical polishing apparatus of FIG. 2.
Figure 13B:
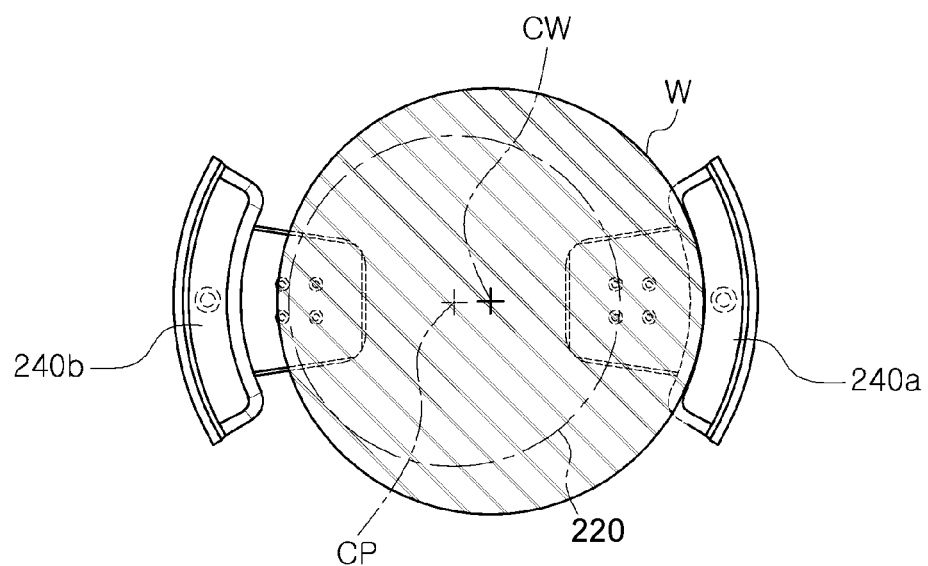

As illustrated in FIG. 13A, the wafer W may be seated on the pedestal 220 by a robot arm. FIG. 13B is a view of the arrangement of the wafer W and the pedestal 220 as seen from above. In an example embodiment, for example, when the wafer W is seated, a center CW of the wafer W and a center CP of the pedestal 220 are misaligned.

Figure 14A:
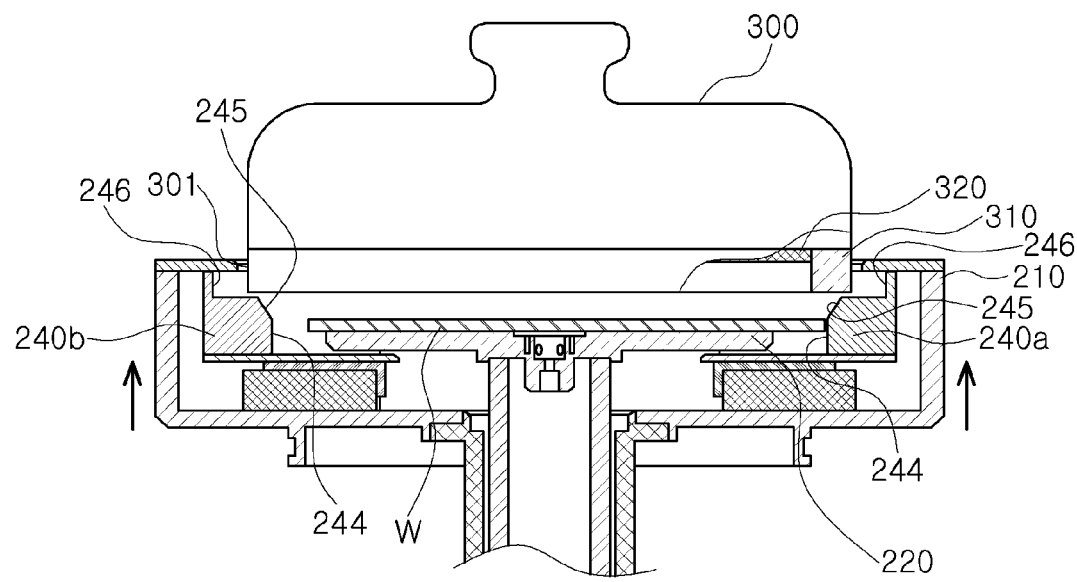

Subsequently, as illustrated in FIG. 14A, the cup 210 may be raised, so that a lateral surface 301 of the polishing head 300 and the polishing head connection portions 246 of the first and second arrangement parts 240a and 240b face each other. The lateral surface 301 of the polishing head 300 may be a portion on which a retainer ring 310 may be disposed. As the cup 210 is raised, the wafer W may slide down along the sliding guide portions 245 of the first and second arrangement parts 240a and 240b so as to face the wafer fixation portions 244 thereof.

Figure 14B:
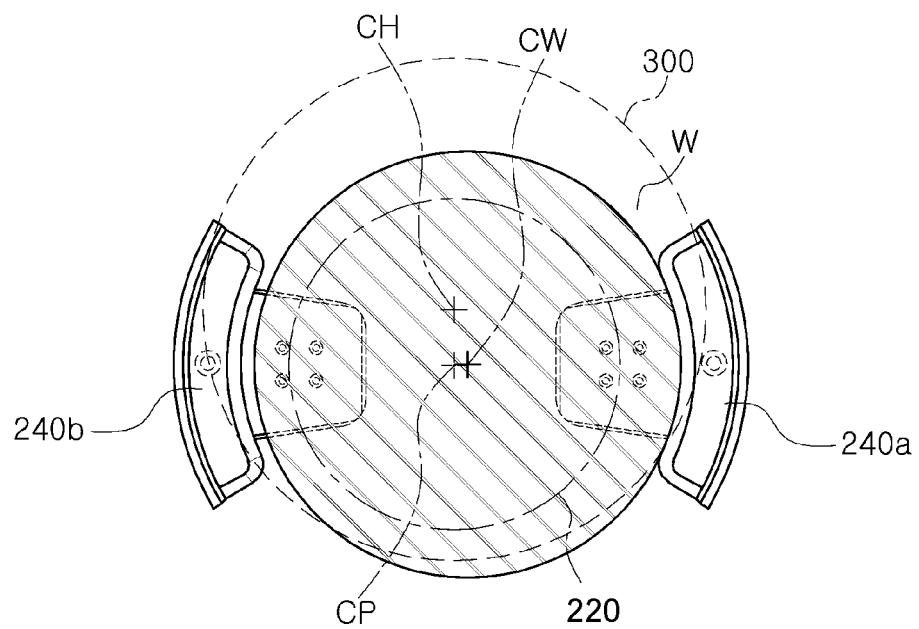

FIG. 14B illustrates the arrangement of a center CH of the polishing head 300, the center CW of the wafer W, and the center CP of the pedestal 220, and in an example embodiment, for example, the center CH of the polishing head 300 and the center CP of the pedestal 220 may be misaligned with each other.

Figure 15A:
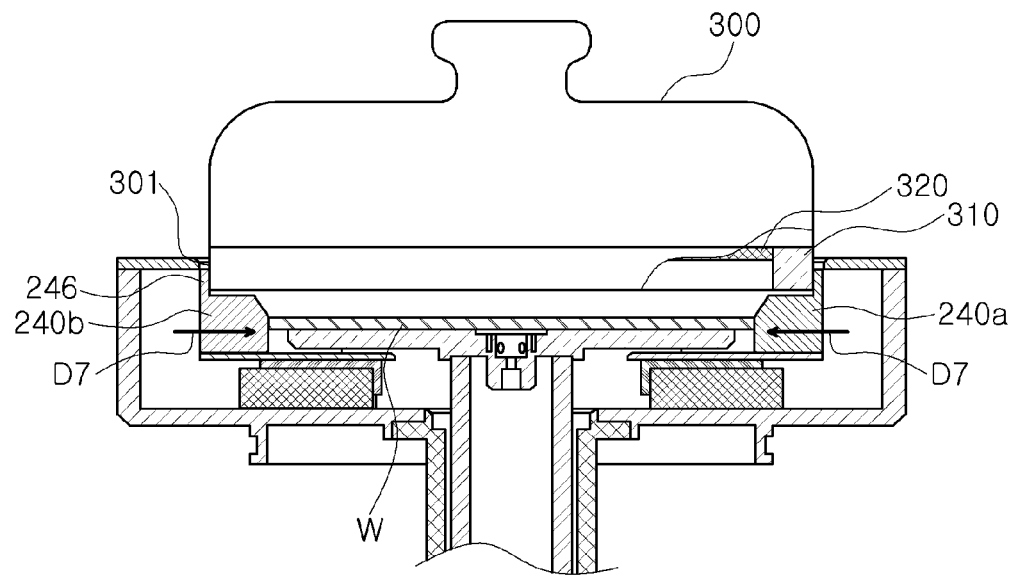
Figure 15B:
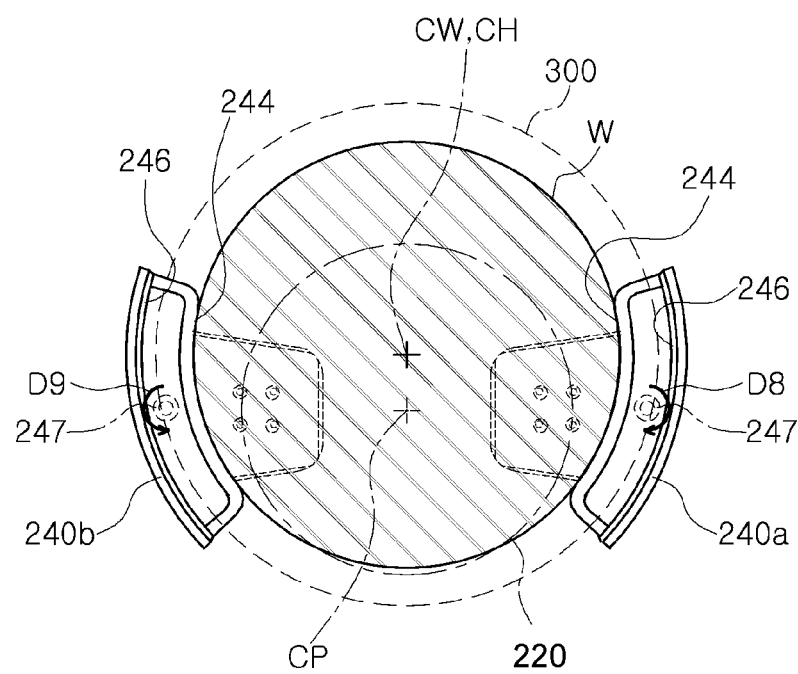

Subsequently, as illustrated in FIGS. 15A and 15B, the first and second arrangement parts 240a and 240b are moved in a D7 direction, respectively (e.g., based on controlled movement by arrangement driving parts 250), so that the polishing head connection portions 246 and the lateral surface 301 of the polishing head 300 contact each other, the arrangement part bodies 243 of the first and second arrangement parts 240a and 240b may be rotated in D8 and D9 directions, respectively, and the wafer W may be guided to the right position by the wafer fixation portions 244. As illustrated in FIG. 15B, the wafer W guided to the right position may allow the center CH of the polishing head 300 to be superimposed on the center CW of the wafer W.

Figure 16A:
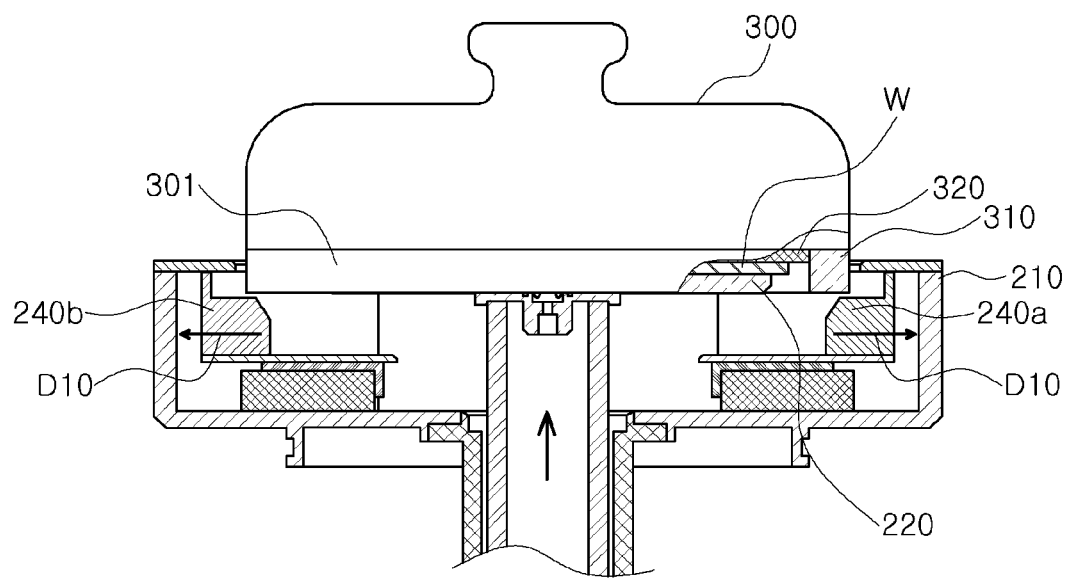
Figure 16B:
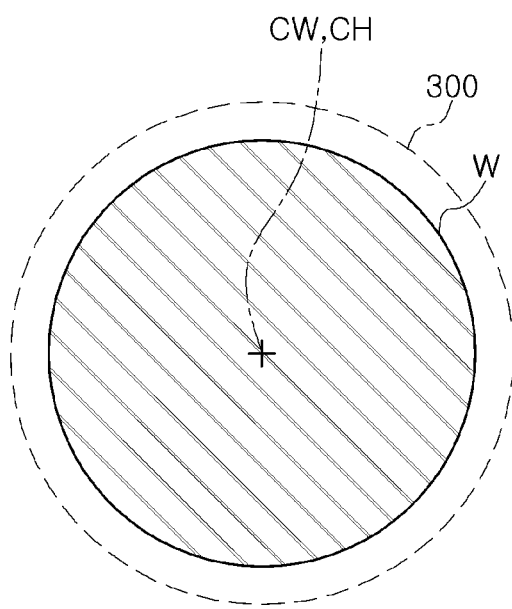

Subsequently, as illustrated in FIG. 16A, when the pedestal 220 is raised so that the wafer W is attached to a membrane 320 of the polishing head 300, and then the first and second arrangement parts 240a and 240b are moved in a D10 direction (e.g., by arrangement driving parts 250) so that the polishing head connection portions 246 and the lateral surface 301 of the polishing head 300 are spaced apart from each other, the wafer W may be loaded on the polishing head 300 while the center CH of the polishing head 300 and the center CW of the wafer W are aligned to be superimposed.

As set forth above, according to example embodiments of the present inventive concept, a load cup of a chemical mechanical polishing apparatus may increase the efficiency of a chemical mechanical polishing (CMP) process.

Figure 17:
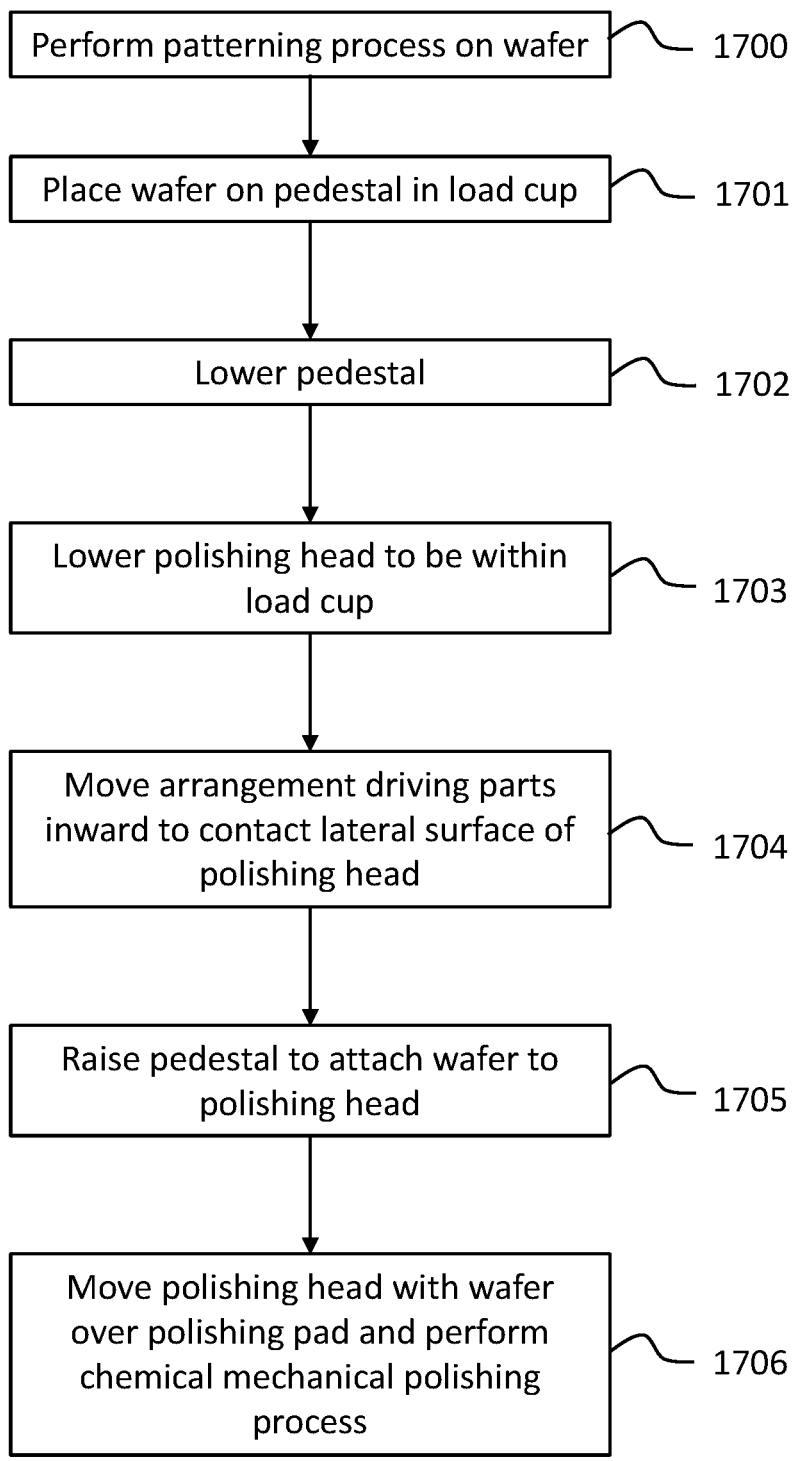
FIG. 17 is a block diagram showing a method of performing a chemical mechanical polishing process on a semiconductor wafer, according to an example embodiment.

FIG. 17 is a block diagram showing a method of performing a chemical mechanical polishing process on a semiconductor wafer, according to an example embodiment.

As can be seen in FIG. 17, in step 1700, a patterning process may be performed to form a pattern on a semiconductor wafer. For example, part of a damascene process may be performed, where an insulating layer is formed on the wafer, the insulating layer is etched or otherwise patterned to form an insulating layer pattern, and a metal layer is then formed on the insulating layer and insulating layer pattern. This patterning process may occur in a first chamber.

Next, in step 1701, the semiconductor wafer is moved from the first chamber to a second chamber for performing chemical mechanical polishing (e.g., planarization). For example, the semiconductor wafer is placed on and received by a pedestal (e.g., pedestal 220) within a load cup (e.g., load cup 200) of a base (e.g., 106). For example, the semiconductor wafer may be placed on the pedestal using a robot arm controlled by a computer system. The load cup may have a structure such as shown in FIGS. 2-4 having one of the arrangement parts shown in FIGS. 6A and 6B, FIG. 8, or FIG. 9. In some embodiments, the semiconductor wafer may not be centered on the pedestal, such as shown in FIG. 13B.

In step 1702, the pedestal is lowered. The lowering may be controlled, for example, by a computer system that controls a pedestal driving part (e.g., 280) connected to a pedestal support part (e.g., 230). During lowering of the pedestal, the wafer may shift horizontally in relation to the pedestal, for example due to a sliding guide portion (e.g., 245) of one or more arrangement part bodies (e.g., 243) of one or more respective arrangement parts (e.g., 240). As a result of the shifting, as the pedestal is lowered further, the wafer may be disposed between the arrangement parts (e.g., between fixation portions of the arrangement part bodies), and one edge of the wafer may contact and may abut against a wafer fixation portion (e.g., 244) of at least one of the arrangement parts. In some embodiments, at this point, the wafer still may not be centered on the pedestal.

In step 1703, which may occur at the same time as, before, or after step 1702, a polishing head (e.g., 300), also described as a wafer pickup head, is lowered in relation to the base, so that a bottom portion of the polishing head is within the load cup. For example, at least part of the polishing head is disposed between polishing head connection portions of the arrangement part bodies. During this step and during step 1702, arrangement driving parts (e.g., 250) connected to the arrangement parts may be controlled, for example by a computer system, so that the arrangement parts are positioned to have wafer fixation portions wider than the wafer and polishing head connection portions wider than the polishing head. This allows both the wafer and the polishing head to be placed within the arcs formed by the arrangement parts, even if not initially centered or contacting the entire curved surfaces of the wafer fixation portion and polishing head connection portion of the arrangement parts. An example of this initial placement can be seen in FIGS. 14A and 14B.

In step 1704, arrangement driving parts (e.g., 250) are controlled to move the arrangement parts inward, such as in direction D7 shown in FIG. 15A. For example, the arrangement driving parts may be controlled by a computer system. In one embodiment, because the arrangement part body (e.g., 243) of each arrangement part is rotatably or slidably connected to the base of the arrangement part (e.g., 241) connected to the arrangement driving part, when the base of the arrangement part is moved in the D7 direction, the arrangement part body may slide or rotate so that the polishing head connection portion (e.g., 246) and the lateral surface (e.g., 301) of the polishing head contact each other. For example, the polishing head connection portion may have a curved surface corresponding to the lateral surface of the polishing head, so that the polishing head connection portion contacts the lateral surface of the polishing head. For example, the arrangement part bodies 243 of the first and second arrangement parts 240a and 240b may be rotated in D8 and D9 directions, respectively, as shown in FIG. 15B. As a further result, edges of the wafer may contact the wafer fixation portions, and the wafer may be guided to a position by the wafer fixation portions to be concentric with the polishing head. For example, the wafer fixation portion may have a curved surface corresponding to the lateral surface of the wafer, to allow for such contact. Thus, even though the wafer is not centered with the pedestal, the centers of the wafer and polishing head align.

In step 1705, the pedestal is raised so that the wafer W is attached to a membrane (e.g., 320) of the polishing head, and then the first and second arrangement parts (e.g., 240a and 240b) may be moved in a D10 direction (e.g., by arrangement driving parts 250, as shown in FIG. 16A), so that the polishing head connection portions and the lateral surface of the polishing head are spaced apart from each other.

In step 1706, the polishing head may pick up the wafer (e.g., by adsorption). Then, the polishing head, with wafer attached, may be moved, for example by moving a frame (e.g., 115 in FIG. 1), so that the wafer is placed over a polishing pad (e.g., 110), A chemical mechanical polishing process may then be performed. For example, the polishing process may include lowering the wafer to the polishing pad, which includes a slurry formed thereon, and polishing the wafer to remove a portion of metal layer and/or insulating layer formed on the wafer. Subsequently, steps 1700 to 1706 may be repeated for forming additional layers and patterns on the semiconductor wafer. In this manner, a chemical mechanical polishing process may be used to form a semiconductor device, such as a semiconductor chip, on the wafer.

Various aspects of the method described in FIG. 17 may be controlled by a computer system, for example that includes one or more computers, input/output devices, a display screen for a user, etc. Such computer systems are known in the field of chemical mechanical polishing, and such a known system can be programmed and used by a person having ordinary skill in the art to perform the various steps described in connection with the invention described herein.

While exemplary embodiments have been shown and described above, it will be apparent to those skilled in the art that modifications and variations could be made without departing from the scope of the present invention, as defined by the appended claims.

What is claimed is:

1. A method of manufacturing a semiconductor device, the method comprising:
   receiving a semiconductor wafer on a pedestal in a cup having an internal space, wherein:
      the pedestal is provided in the internal space, and is configured to be lifted up and lowered down, and
      a plurality of arrangement parts having a plurality of respective base portions and a plurality of respective arrangement part bodies coupled thereto are disposed around the pedestal;
   lowering the pedestal within the cup so that the wafer is disposed between wafer fixation portions of the arrangement part bodies;
   lowering a polishing head into the cup so that at least part of the polishing head is disposed between polishing head connection portions of the arrangement part bodies;
   moving each of the plurality of arrangement parts horizontally in a direction toward a center of the pedestal, wherein as a result of the moving, the arrangement part bodies are rotated or reciprocated so as to contact a lateral surface of the polishing head, thereby adjusting a center of the wafer to be aligned with a center of the polishing head;
   picking up the wafer with the polishing head; and
   performing a polishing process on a layer formed on the wafer.

2. The method of claim 1, further comprising:
   driving parts disposed below the plurality of arrangement parts, respectively; and
   using the driving parts to move the plurality of base portions horizontally, respectively, in the direction toward the center of the pedestal.

3. The method of claim 2, wherein the plurality of arrangement parts comprise a first arrangement part including a first arrangement part body and a second arrangement part including a second arrangement part body, and the driving parts move the first arrangement part and the second arrangement part symmetrically toward a center of the pedestal.

4. The method of claim 3, wherein as the first arrangement part and the second arrangement part are moved horizontally, the first arrangement part body and second arrangement part body rotate or reciprocate so that the lateral surface of the wafer contacts the wafer fixation portions of the first and second arrangement part bodies and the lateral surface of the polishing head contacts the polishing head connection portions of the first and second arrangement part bodies.

5. The method of claim 1, wherein the arrangement part bodies are coupled to the plurality of base portions, respectively, by one of a ball bearing, a linear motion guide, a ball bush, and a spring.

6. The method of claim 1, wherein each of the plurality of arrangement parts comprises:
   a polishing head connection portion shaped to contact the lateral surface of the polishing head;
   a sliding guide portion extending from the polishing head connection portion, and comprising an inclined surface; and
   a wafer fixation portion extending from the sliding guide portion, and shaped to contact the lateral surface of the wafer so as to adjust an arrangement position of the wafer.

7. The method of claim 6, wherein lowering the pedestal within the cup further includes:
   causing the wafer to contact the sliding guide portion of at least one of the plurality of arrangement parts, thereby horizontally shifting the position of the wafer as the pedestal is lowered within the cup.

8. A method of manufacturing a semiconductor device using chemical mechanical polishing, the method comprising:
   providing a base part having a polishing pad and a load cup;
   providing a polishing head,
   wherein the load cup comprises:
      a pedestal having a seating surface on which a wafer is seated,
      a cup having the pedestal disposed therein, and
      a plurality of arrangement parts disposed around the pedestal;
   placing a wafer on the pedestal;
   lowering the pedestal within the load cup;
   moving the arrangement parts horizontally in a direction toward a center of the pedestal,
   wherein as a result of the moving:
      a polishing head connection portion of each arrangement part contacts a lateral surface of the polishing head,
      a wafer fixation portion of each arrangement part contacts a lateral surface of the wafer, and
      the wafer is aligned with the polishing head;
   picking up the wafer with the polishing head; and
   performing a polishing process on a layer formed on the wafer.

9. The method of claim 8, further comprising using driving parts disposed below the plurality of arrangement parts, respectively, to move the plurality of arrangement parts horizontally in the direction toward the center of the pedestal.

10. The method of claim 8, wherein lowering the pedestal within the load cup further comprises:
    shifting the wafer horizontally by a sliding guide portion of an arrangement part, the sliding guide portion extending from the polishing head connection portion of the arrangement part and comprising an inclined surface.

11. The method of claim 10, wherein each of the plurality of arrangement parts comprises:
    a fastening portion coupled to a respective driving part; and
    an arrangement part body coupled to the fastening portion by a coupling member so as to enable a rotary or reciprocating motion, and having the wafer fixation portion, the sliding guide portion, and the polishing head connection portion sequentially disposed thereon.

12. The method apparatus of claim 11, wherein the coupling member is one of a ball bearing, a linear motion guide, a ball bush, and a spring.

13. The method of claim 11, wherein the arrangement part body comprises a plurality of regions divided in a circumferential direction of the wafer.

14. The method of claim 13, wherein each of the plurality of regions comprises the coupling member coupled to the fastening portion.

15. The method of claim 8, wherein the polishing head connection portion has a curved surface corresponding to the lateral surface of the polishing head.

16. The method of claim 8, wherein the wafer fixation portion has a curved surface corresponding to the lateral surface of the wafer.

17. The method of claim 8, wherein prior to moving, the plurality of arrangement parts are disposed around the pedestal at equal intervals.

18. The method of claim 8, wherein the polishing head and the wafer are aligned such that a center of the polishing head and a center of the wafer are superimposed.

19. A method of manufacturing a semiconductor device using a chemical mechanical polishing apparatus, the method comprising:
    providing a base part having a load cup, the load cup including a pedestal having a seating part for mounting a wafer and a cup in which the pedestal is received and having an upper surface with a through hole;
    inserting a polishing head in the through hole;
    providing a plurality of alignment parts having a plurality of respective fastening portions and a plurality of respective alignment part bodies disposed around the pedestal;
    using a plurality of respective driving parts, moving the plurality of alignment parts horizontally in a direction toward a center of the pedestal;
    rotating or reciprocating alignment part bodies coupled to the plurality of fastening portions, respectively, so as to contact a lateral surface of the polishing head, and adjust a center of the wafer to be aligned with a center of the polishing head;
    picking up the wafer with the polishing head; and
    performing a polishing process on a layer formed on the wafer.

20. The method of claim 19, further comprising:
    spraying a cleaning fluid into the cup using a plurality of nozzles; and
    removing the cleaning fluid through a hollow portion of a support part that supports the seating part.

* * * * *